US012732210B1

(12) United States Patent
Trimble

(10) Patent No.: US 12,732,210 B1
(45) **Date of Patent: *Sep. 8, 2026**

(54) LOSSLESS COMPRESSION FOR MULTIVARIATE SELECTIVE ENCODING

(71) Applicant: Two Six Lab, LLC, Arlington, VA (US)

(72) Inventor: Jeremy W. Trimble, Annandale, VA (US)

(73) Assignee: Two Six Labs, LLC, Arlington, VA (US)

( * ) Notice: Subject to any disclaimer, the term of this patent is extended or adjusted under 35 U.S.C. 154(b) by 40 days.

This patent is subject to a terminal disclaimer.

(21) Appl. No.: 18/778,095

(22) Filed: Jul. 19, 2024

Related U.S. Application Data

(63) Continuation of application No. 17/164,423, filed on Feb. 1, 2021, now Pat. No. 12,132,503.

(51) Int. Cl.
*H03M 7/30* (2006.01)
*H03M 7/40* (2006.01)
*H04L 67/12* (2022.01)

(52) U.S. Cl.
CPC ....... *H03M 7/3082* (2013.01); *H03M 7/4075* (2013.01); *H03M 7/6064* (2013.01); *H04L 67/12* (2013.01)

(58) Field of Classification Search
CPC ............. H03M 7/3082; H03M 7/4075; H03M 7/6064; H04L 67/12
See application file for complete search history.

(56) References Cited

U.S. PATENT DOCUMENTS

2008/0194211 A1* 8/2008 Suehiro .................. H04J 13/10 455/75
2010/0183065 A1* 7/2010 Siti ...................... H04L 25/067 375/233
2010/0332238 A1* 12/2010 Netsch ............... G10L 19/0017 704/500

FOREIGN PATENT DOCUMENTS

CA 2679995 C * 6/2014 ............ H04N 19/48

OTHER PUBLICATIONS

Machine translation of KR-20210158427-A (Year: 2021).*

* cited by examiner

*Primary Examiner* — Jean B Corrielus
(74) *Attorney, Agent, or Firm* — Armis IP Law, LLC

(57) ABSTRACT

A deployment of radiologic beacons detect radiation levels for emitted radiation around a particular geographic area such as a town, city or campus environment. In a deployment of beacons for detecting and gathering radiological gamma-ray spectral data, each beacon periodically generates a set of values indicative of radiation at a particular energy level, and assembles a vector of the set of values ordered according to increasing energy levels. Each of the beacons transmits the vector as a stream or periodic sequence of data to a common aggregation location. Each beacon encodes the data according to a compression mechanism based on a Poisson distribution of the spectral data. A running average of the values for each energy level is maintained for the sequence of vectors, and encoding/decoding mechanisms are selected based on the average value to be encoded.

13 Claims, 11 Drawing Sheets

GENERATE A SEQUENCE OF VECTORS BASED ON READINGS RECEIVED FROM A BEACON, EACH VECTOR DEFINING AN ARRAY OF VALUES IN ORDERED POSITIONS
300

ENCODE EACH VECTOR IN THE SEQUENCE USING AN ENCODING PROCESSOR SELECTED BASED ON AN AVERAGE OF VALUES OF EACH POSITION IN THE SEQUENCE OF VECTORS
301

RECEIVE THE ENCODED VECTOR AT A DISTAL NETWORK LOCATION, THE DISTAL NETWORK LOCATION CONFIGURED FOR RECEIVING VECTORS FROM A PLURALITY OF BEACONS
302

SELECT, FOR EACH POSITION IN THE RECEIVED VECTOR, A DECODING PROCESSOR CORRESPONDING TO THE ENCODING PROCESSOR, THE SELECTION BASED ON THE SAME AVERAGE OF VALUES OF EACH POSITION INVOKED FOR THE ENCODING
303

| Number | 8-bit Binary Encoding | "Unary" Encoding | Huffman Encoding ★ |
|---|---|---|---|
| 0 | 0000 0000 | 0 | 1 |
| 1 | 0000 0001 | 10 | 010 |
| 2 | 0000 0010 | 110 | 011 |
| 3 | 0000 0011 | 1110 | 001 |
| 4 | 0000 0100 | 11110 | |
| 5 | 0000 0101 | 111110 | 000 |
| 6 | 0000 0110 | 1111110 | |
| Encoded Length | 128 bits (16 numbers * 8 bits/number) | 40 bits CR = 3.2 | 28 bits CR = 4.6 |

| Number | 8-bit Binary | Golomb Coding | | |
|---|---|---|---|---|
| | | M-2 | M-5 | M-20 |
| 0 | 0000 0000 | 00 | 000 | 00000 |
| 1 | 0000 0001 | 01 | 001 | 00001 |
| 2 | 0000 0010 | 100 | 010 | 00010 |
| 3 | 0000 0011 | 101 | 0110 | 00011 |
| 4 | 0000 0100 | 1100 | 0111 | 00100 |
| 5 | 0000 0101 | 1101 | 1000 | 00101 |
| 6 | 0000 0110 | 11100 | 1001 | 00110 |
| ... | | | | |
| 99 | 0110 0011 | 51 bits | 23 bits | 10 bits |

unary 601-1
fibonacci 601-2
truncated mo-Huffman 601-3
mo-unary 601-4
mo-fib 601-5
elias gamma 601-6
mo-elias gamma 601-7
mo-golomb 601-8
Shannon Limit 601-9
A
Comparison of Encoding Schemes for Poisson-distributed Spectral Bins
Average bits per spectral bin
Poisson Rate
0
1
2
3
4
5
6
0
2
4
6
8
10
12
14
610
601-1
601-6
601-2
601-4
601-7
601-5
601-8
601-3
1.57
601-9
620

FIG. 9B

LOSSLESS COMPRESSION FOR MULTIVARIATE SELECTIVE ENCODING

RELATED APPLICATIONS

This application is a Continuation (CON) of earlier filed U.S. patent application Ser. No. 17/164,423, now U.S. Pat. No. 12,132,503, entitled "LOSSLESS COMPRESSION FOR MULTIVARIATE SELECTIVE ENCODING", filed on Feb. 1, 2021, the entire teachings of which are incorporated herein by this reference.

STATEMENT REGARDING FEDERALLY SPONSORED RESEARCH AND DEVELOPMENT

This invention was made, at least in part, with government support under contract no. number 70RWMD19C00000005. The government has certain rights in the invention.

BACKGROUND

Modern computer and storage capability allows substantial storage volume for data gathered from passive observation of environmental, ambient and atmospheric conditions. Collection of readily observable background data, however sparse, may prove beneficial in subsequent studies, observations or analyses. The advent of so-called "Big Data" has ushered in a heightened order of magnitude for data gathering and storing, often without necessarily having a consumer for such data—the mere availability justifies the gathering and storing costs.

In an example of radiation emission detector beacons, or radiological beacons, ambient discharge in the electromagnetic spectrum can be indicative of unknown, harmful and/or illicit transport of radioactive materials. Much of the relevant data is either sparse (meaning zero or null) or somewhat invariant due to normal background radiation detection from naturally occurring sources. Data transmission costs for maintaining a plurality of deployed beacons for detecting and gathering radiological gamma-ray spectral data can be substantial.

SUMMARY

A deployment of radiologic beacons detect radiation levels for emitted radiation around a particular geographic area such as a town, city or campus environment. In a deployment of beacons for detecting and gathering radiological gamma-ray spectral data, each beacon periodically generates a set of values indicative of radiation at a particular energy level, and assembles a vector of the set of values ordered according to increasing energy levels. Each of the beacons transmits the vector as a stream or periodic sequence of data to a common aggregation location. Due to the aggregate volume of radiologic data, each beacon encodes the data according to a compression mechanism, and the aggregation location decodes the data according to a complementary decoding mechanism or algorithm. A running average of the values for each energy level is maintained for the sequence of vectors, and encoding/decoding mechanisms are selected based on the average value to be encoded. The running average demonstrates a Poisson distribution of the values at each energy level operating as a predictor of an optimal encoder for each value, recognizing the likelihood that the average of previous transmitted values indicates a likely value for a current radiologic reading.

Configurations herein are based, in part, on the observation that data compression algorithms are often employed for reducing a size of a volume of data for transmission, for more efficient use of bandwidth, particular in a fee-for-services arrangement based on a volume of transmitted data. Lossless compression (encoding) allows recreation (decompression, or decoding) of the data as it existed prior to transmission, and is typically preferable, albeit often subject to a lower compression ratio (CR), meaning the percent of the data volume reduced. Lossy compression allows lower data volume at the cost of some loss of precision or quality of the data, which may be appropriate for certain statistical or summary data. Unfortunately, conventional approaches suffer from the shortcoming that variance in the CR can be substantial, and is often dependent of the nature of the data being transmitted. For example, sparse data, meaning data having many zero or null values, can be compressed very efficiently for the zero-consisting portions, but a sudden incidence of nonzero values may incur a substantial degradation in the overall efficiency.

Accordingly, configurations herein substantially overcome the shortcomings of conventional compression by selecting a coding mechanism or algorithm based on a quality or value of the data to be compressed, and continually reevaluating the values for encoding. A decoding (decompression) operation by the receiver of the compressed data follows the same selection logic used to encode the values, thus mitigating a large overhead of additional data for defining the selected encoding approach.

In further detail, configurations herein depict a method of transmitting a recurring sequence of data from radiological detection beacons. Each beacon generates a sequence of vectors based on readings received by the beacon, such that each vector defines an array of values in ordered positions. Each beacon of a plurality of beacons in a region encodes each vector in the sequence using an encoding processor selected based on an average of values of each position in the sequence of vectors. A central monitoring facility receives the encoded vector at a distal network location configured for receiving vectors from the beacons for gathering and aggregating. The central monitoring facility selects, for each position in the received vector, a decoding processor corresponding to the encoding processor, such that the selection is based on the same average of values of each position invoked for the encoding, therefore allowing selection of the proper decoder to match the encoding processor.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIGS. 9A-9B are a flowchart for encoding spectral data using encoding processing selection as in FIGS. 3-8.

DETAILED DESCRIPTION

In the discussion that follows, an example network based data collection reduces the transmission of cellular data costs associated with deploying region-scale radiological threat sensing by reducing the amount of data sent, in particular efficiently compressing a time-series of gamma-ray radiological spectra. There is generally no single compression algorithm that is optimal for all types of data-rather, certain compression approaches perform more or less effectively on different types of data. Effectiveness of a compression algorithm is measured by the factor by which it reduces the size of its input, often referred to as the compression ratio which is computed as the size of the input divided by the size of the output. Compression ratios higher than 1.0 are desirable though not always guaranteed by any particular compression approach.

Configurations herein are based on performance of a number of lossless compression algorithms on radiological gamma-ray spectral data produced by a variety of radiological sensors that report to a common aggregation computer or data center. In particular, Golomb encoding, one of the encoding modes used by the approach below, is a particularly beneficial variable-length integer code for certain probability distributions.

Configurations herein employ a "predictor" value to attempt to predict current/future data based on previously-observed data. Particular prediction-based approaches have varying effectiveness with a reduction in bandwidth. In a particular approach for a potential solution to the problem of gamma-ray spectral compression, improvements on use of so-called ZERO_PACK approaches that benefit from long runs of zero data can be challenging.

Figure 1:
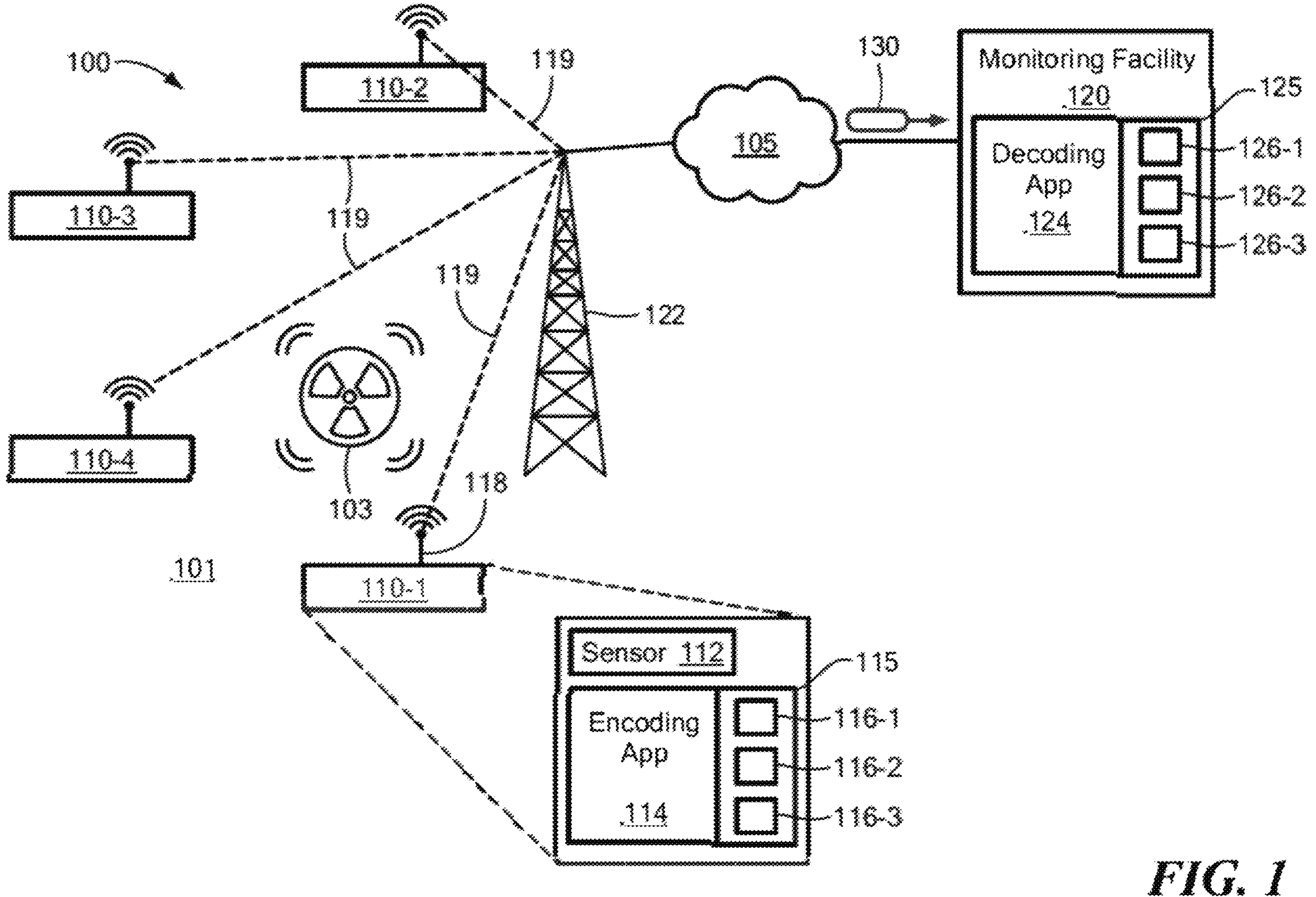
FIG. 1 is a context diagram of a data gathering environment suitable for use with configurations herein using electromagnetic spectral data gathering.

FIG. 1 is a context diagram of a data gathering environment suitable for use with configurations herein using electromagnetic spectral data gathering. A data collection arrangement utilizing a plurality of transmitter stations or beacons disposed intermittently around an area may be useful for detecting and accumulating a stream of data about a certain phenomenon or presence in the area so monitored. In the case of radiological data analysis, a time-series of gamma-ray radiological spectra emanates substantial volumes of data for transmission and analysis. Conventional cellular data transmission is often available for gathering and directing such data to a central computer or aggregation location, however can incur substantial cost. Compressive encoding (encoding) is therefore desirable for mitigating bandwidth.

Referring to FIGS. 1, an example of lossless compression via selective encoding is illustrated for a network 100 of radiological beacons 110-1 . . . 110-4 (110 generally). Various other data sensing approaches may be employed. The beacons 110 are disposed around a sensing environment 101 and communicate with a central computer/monitoring facility 120 via a wireless medium such as cellular data via cell tower 122 and transmission medium such as the Internet 105. Each beacon 110 includes detection sensors 112 and an encoding application 114 with encoding logic 115. The encoding logic 115 includes one or more encoding processors (encoders) 116-1 . . . 116-3 (116 generally), selected by the encoding logic as discussed further below. A wireless antenna 118 allows transmission of wireless signals 119 to the cell tower 122 for receipt by the monitoring facility 120.

The monitoring facility 120 includes an aggregation and gathering application 124 with decoding logic 125. The decoding logic 125 is complementary to the encoding logic 115 and includes decoding processors (decoders) 126-1 . . . 126-3 for decompressing the spectral data 130 transmitted from the beacons 110.

Figures 2, 3:
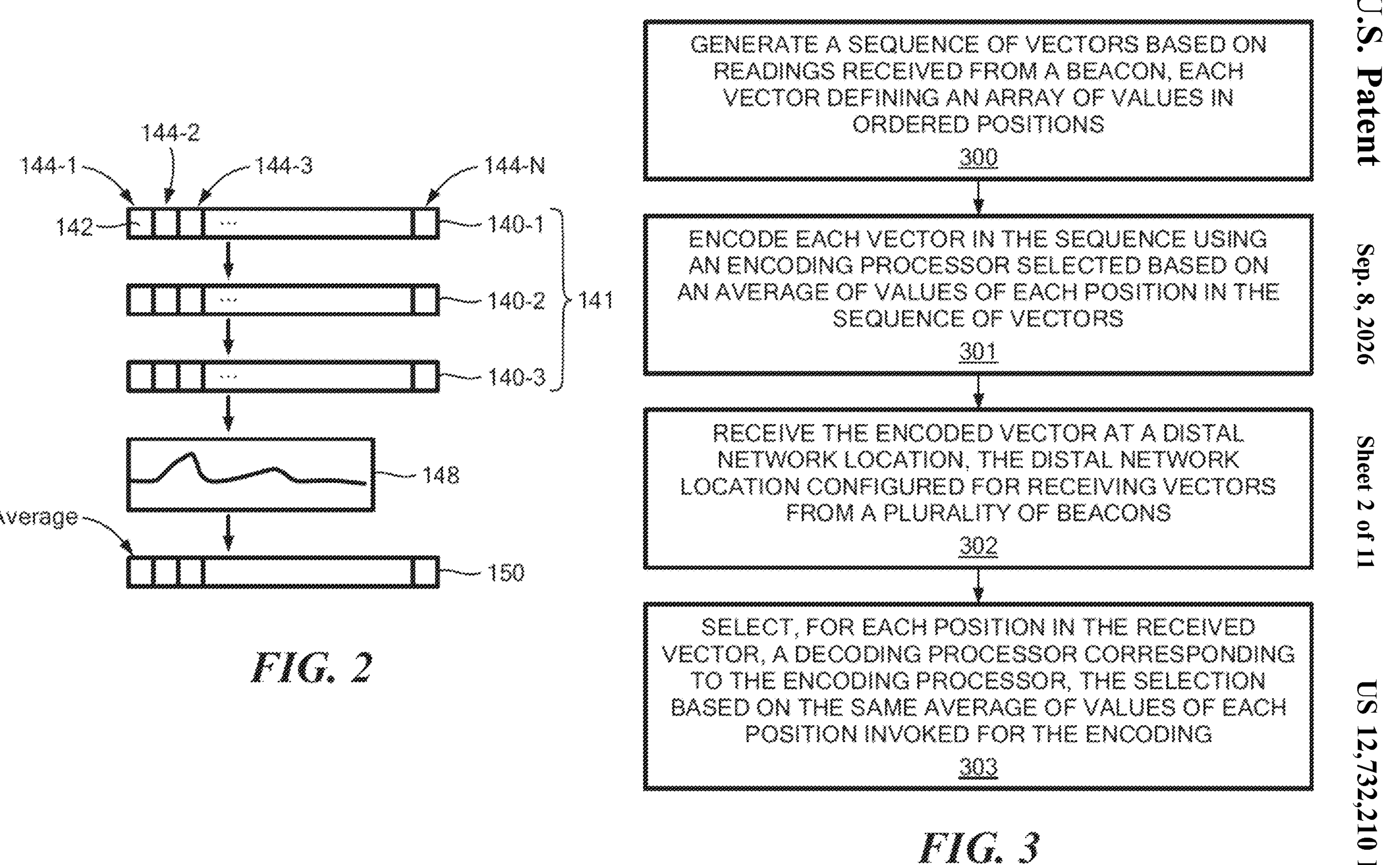
FIG. 2 is a block diagram of gathered spectral data of FIG. 1 defining a Poisson distribution.
FIG. 3 is a flowchart of spectral data compression and encoding for the spectral data of FIG. 2.

FIG. 2 is a block diagram of gathered spectral data of FIG. 1 defining a Poisson distribution. Referring to FIGS. 1 and 2, each beacon 110 includes sensors 112 for detecting spectral data indicative of radiation emissions or similar electromagnetic discharge. Other configurations may employ a network 100 of beacons 110 for gathering other types of data, such as weather, airborne toxins, environmental conditions and others for transmission and aggregation as disclosed herein. As previously alluded, each beacon 110 takes periodic measurements of spectral data for transmission. The spectral data 130 includes values denoting a strength of gamma radiation 103 at various energy levels, depicted as a vector 140. Over time, a series or set 141 of vectors 140-1 . . . 140-3 emerges from periodic sampling intervals. Each vector 140 includes values 142 at positions 144-1 . . . 144-N (144 generally). The number of positions 144 depends on a granularity and energy level measured by the sensors 112, therefore each position 144 represents radiation detected at increments of increasing energy levels. Each vector 140 may also be defined by a histogram 148 of values, or bins, increasing based on the energy level at which the value occurs, discussed further below. The histogram 148 provides a continuity expressed as an upward or downward trend that may clarify peaks or concentrations of energy levels, but is not strictly necessary for the calculation of values in discrete bins.

FIG. 1 represents an example that is readily scalable. Each of additional beacons 110, periodicity of the timing interval, and granularity of the detected energy levels that affects the number of positions 144 or elements in each vector are all multiples in the total bandwidth demand. The claimed approach benefits the compression of any periodic data gathering of data expressible as a vector or array of elements. In can be observed that while the energy levels may not, for example, follow a statistical "bell curve" of entries concentrated around the middle range of energy levels, successive readings are likely to be represented by previous readings in the same element, or "bin" of energy levels, depicted as positions 144 in each vector 140. As multiple vectors are received, the encoding application 114 maintains a reference vector 150 defined by a running average of each respective position, such that each position in the reference vector 150 defines a statistical "bin" computed from an average of values in the corresponding position 144 in the sequence of vectors 150. In other words, the encoding application computes the reference vector 150 based on an average value appearing in each respective position 144 in the sequence of vectors 150.

The values 142 in the received vectors 140 therefore tend towards a Poisson distribution, such that successive values for each bin/position, reflecting radiation at a particular energy level, are likely to be reflective of, or inertially influenced by, previous readings for that energy level. The significance of a Poisson distribution will be discussed in greater detail below, however it can be noted that the beacons 110 are radiologic beacons adapted for receiving radiation spectrum data of detected radiation 103, and each vector 140 of the sequence of vectors 140-N defines a set of ordered values indicative of radiation at a particular energy level. Each of the positions 144 in the vector 140 defines increasing energy levels of radiation detected at a geographic position of the beacon 110.

FIG. 3 is a flowchart of spectral data compression and encoding for the spectral data of FIG. 2. Referring to FIGS. 1-3, in operation, the method of transmitting a recurring sequence of data 130 from the beacons 110 includes, at step 300, generating a sequence of vectors 140 based on readings received from a beacon 110, such that each vector defines an array of values 142 in ordered positions 144. Encoding logic 115 encodes each vector 140 in the sequence using an encoding processor 116 selected based on an average of values of each respective position 144 in the sequence of vectors 140, as depicted at step 301. In other words, the average in position i in the reference vector 150 results from the average of the values 142 in each of the received vectors 140-N for position i. Following transmission, the data 130 is received by the monitoring facility 120, which receives the encoded vector at a distal network location common to all beacons 110, such as the monitoring facility 120, such that the distal network location is configured for receiving vectors from a plurality of beacons 110-N, as disclosed at step 302. Since the gathering application 124 maintains the same reference vector 150' (FIG. 7B) as the beacon 110, the corresponding decoder is selected by, for each position 144 in the received vector 140. The decoding processor 126-1 . . . 126-3 (126 generally) corresponds to the encoding processor 116, such that the selection is based on the same average of values of each position 144 invoked for the encoding. Since the selected encoding processor (by 115) depends only on the rate estimate computed as a function of previously-observed data and stored in the reference vector 150, the selected encoding mode can be derived independently by both the encoder 116 and the decoder 126 without being explicitly represented in the compressed data stream. Therefore, no flag or data item is needed in the spectral data 130 carrying the vector 140 because both the encoder 116 and decoder 126 compute the same reference vector 150 based on transmitting/receiving the same sequence of vectors 140.

Figure 4:
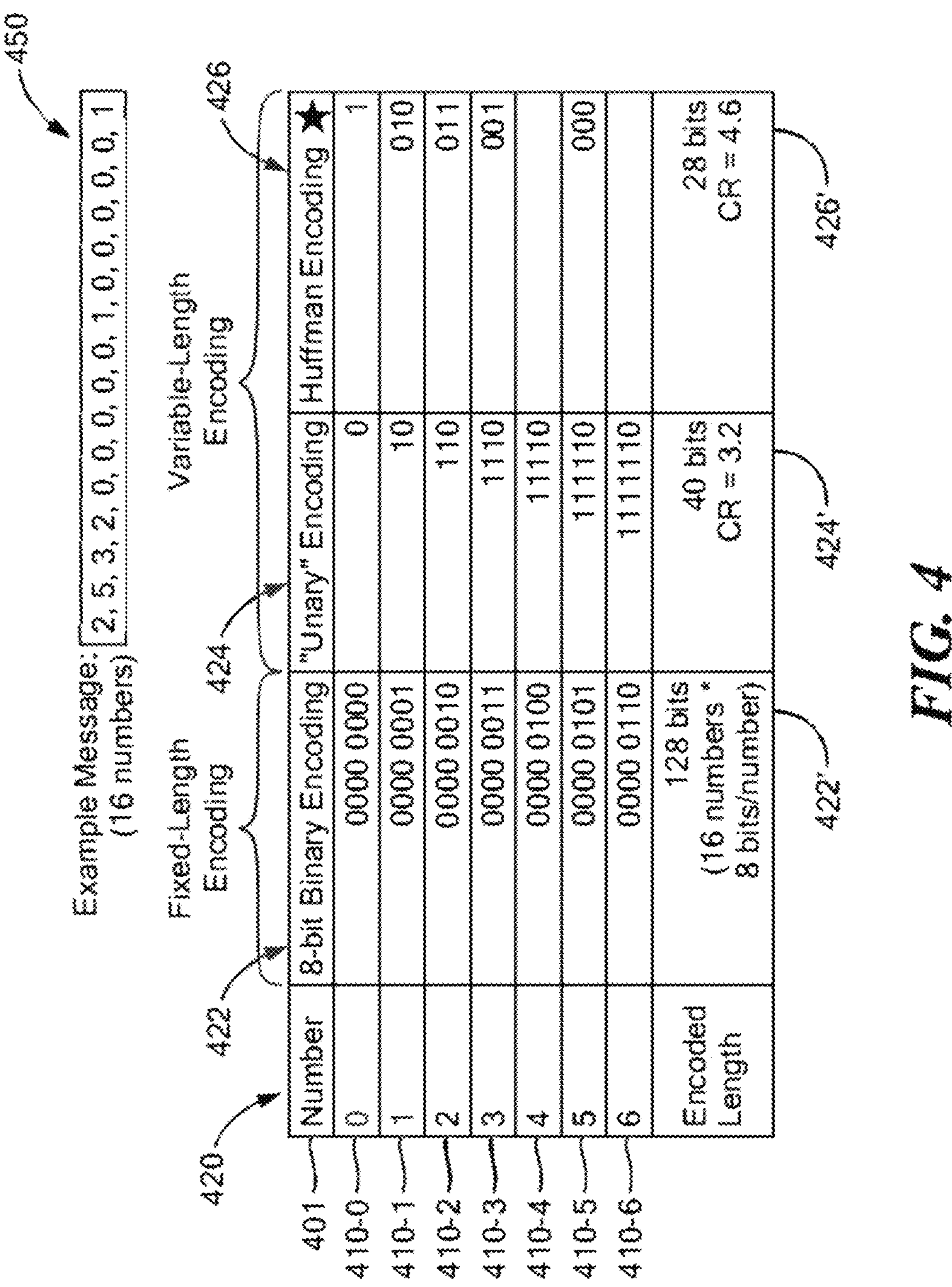
FIG. 4 is an example of different encoding schemes applicable to the spectral data of FIGS. 1-3.

FIG. 4 is an example of different encoding schemes applicable to the spectral data of FIGS. 1-3. Referring to FIGS. 1-4, both the encoding logic 115 and decoding logic 125 select an encoder/decoder 116/126 for use with each of the values 142 of each position 144 in the vector. The significance of different encoding schemes is shown in FIG. 4. An encoding table 401 includes entries 410-0 . . . 410-6 (410 generally) of encoding forms for values. An example message 450 has a sequence of comma delimited values. To generate a corresponding encoded message, each of the 16 values in the message 450 is mapped to the encoding table to determine the encoded form. Each entry 410 includes a value 420, an a 8-bit binary encoded (fixed length) form 422, and variable length encoding forms for unary 424 and Huffman 426 encoding.

As can be seen from the encoding table 401, the manner of encoding (based on the encoder/decoder processor invoked) can effect substantial savings in needed bandwidth for a particular value. For example, the first value “2” from the message 450 sequence, in entry 410-2, occupies 8 bits for 8-bit binary encoding 422, demonstrating no savings over conventional ASCII representation, 3 bits for unary encoding 424, or 3 bits for Huffman encoding 426. Repeating this table mapping for the full message 450 sequence yields the aggregate bit totals 422', 424' and 426', along with corresponding CR metrics. The encoding logic 115 encodes each value 142 in the vectors 140 in the sequence 141 by selectively applying an encoding mechanism to each value 142 in the vector, such that the applied encoding mechanism is based on an average of values appearing in the respective position in previous vectors 140, codified in the reference vector 150.

It is noteworthy that the encoding logic 115 selects an encoding processor 116-N for each value 142 of the input vector 140. Conventional approaches would likely need to include additional information to denote the encoder so that the decoding application 125 may select the corresponding decoder process 126. As can be seen in the encoder table 401, if encoding schemes can gain only 3 or 4 bits per encoded value, and the same (or nearly the same) number of bits is required to identify the encoding/decoding scheme used, than efficiency gains may be minimal. In contrast, however, since the encoder/decoder selection is made according to the reference vector 150, computed by both the encoder and decoder to contain the same values, no additional space to denote the encoding scheme is required.

This distinction will be employed in the discussion below. The encoder/decoder logic 115/125 may invoke any suitable encoder/decoder processor for achieving a maximal compression rate, and at a granularity that can change for each encoded value. Conventional approaches require a less granular approach, for example using the same encoder for a full message. This limits the overall efficiency, because some encoders may work better for smaller values and others may handle larger values more efficiently. An encoder that handles a run of zeros rather efficiently may experience a drop-off with larger values, and therefore the overall efficacy with the zero run is offset by the larger values, when a single encoding scheme is imposed on the full message.

Figure 5:
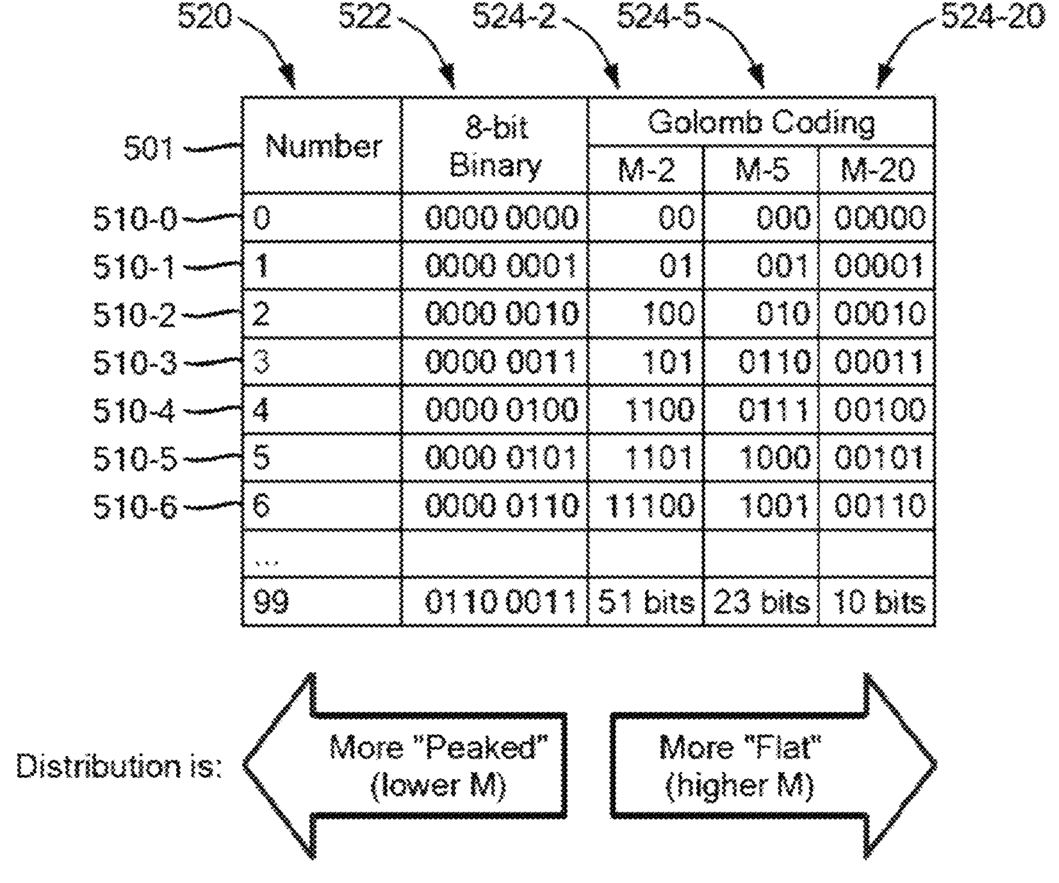
FIG. 5 is an example of a particular encoding processor as in FIG. 4 for performing Golomb encoding.

FIG. 5 is an example of a particular encoding processor as in FIG. 4 for performing Golomb encoding (coding). Golomb encoding is one of several that may be employed for the encoding/decoding processors 116/126. Golomb is a variable length encoding scheme, and allows for a tunable parameter M that “shifts” the efficiency to be more suited to larger or smaller values. Referring to FIGS. 4 and 5, an encoding table 501 includes entries 510-1 . . . 510-N (510 generally) for mapping values for encoding. Column 522 depicts binary encoding as in table 401, however columns 524-2, 524-5 and 524-20 show Golomb encoding for an M parameter of M=2, M=5 and M=20, respectively. Based upon the Poisson process assumption and the estimated rate parameter at the current time instant, the most efficient encoding is selected from a precomputed lookup table which maps the estimated rate parameter to the optimal encoding processor 116. In operation, the encoder 115 determines the Golomb parameter M by performing a lookup of Golomb parameters based on the ordered value, which may be tuned based on an observed or intended CR. This provides for Golomb encoder with an offset encoding parameter optimized for a predetermined probability distribution.

Figure 6A:
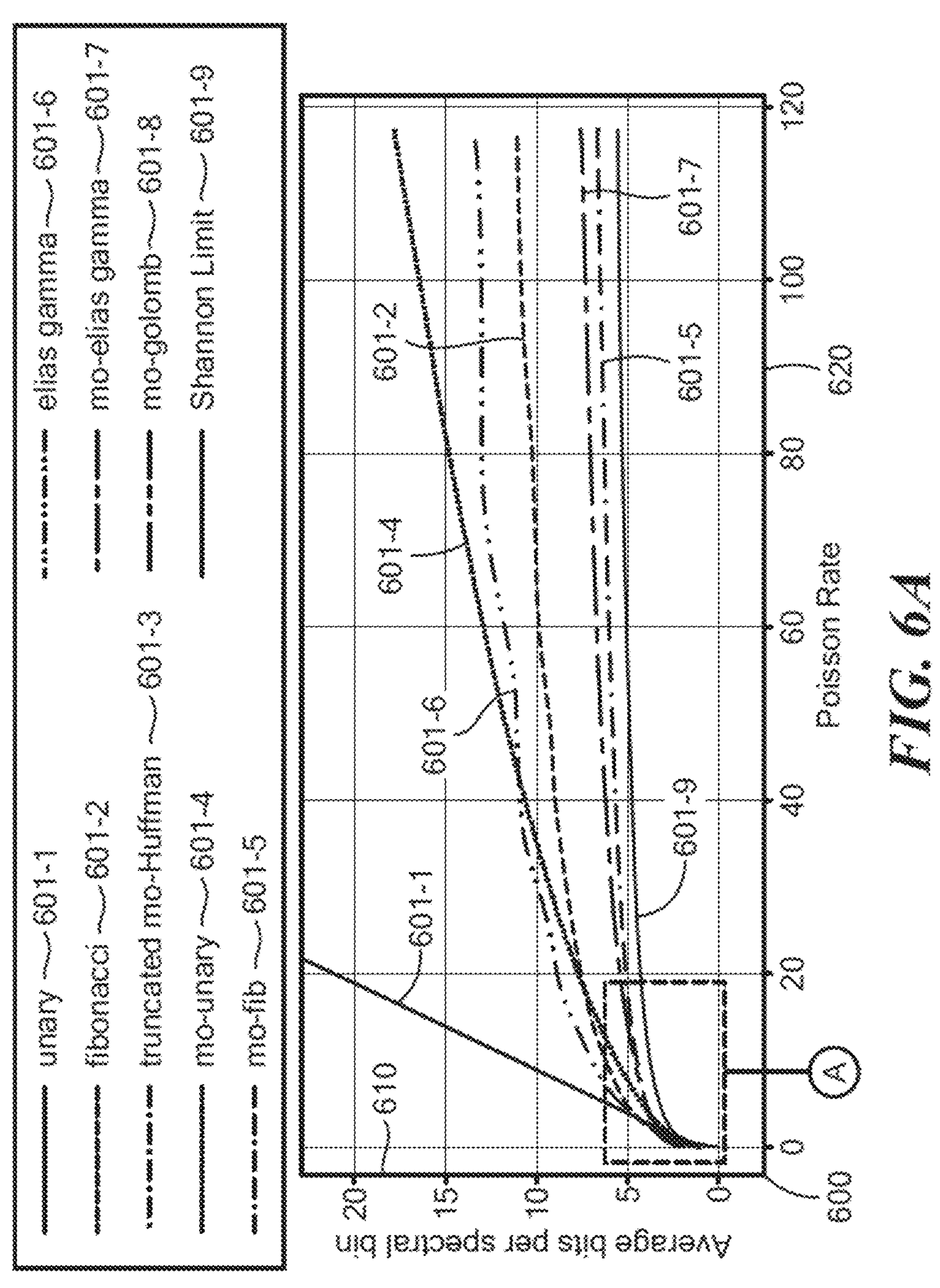
FIGS. 6A and 6B show performance variations of different encoding processors in FIGS. 3-5.
Figure 6B:
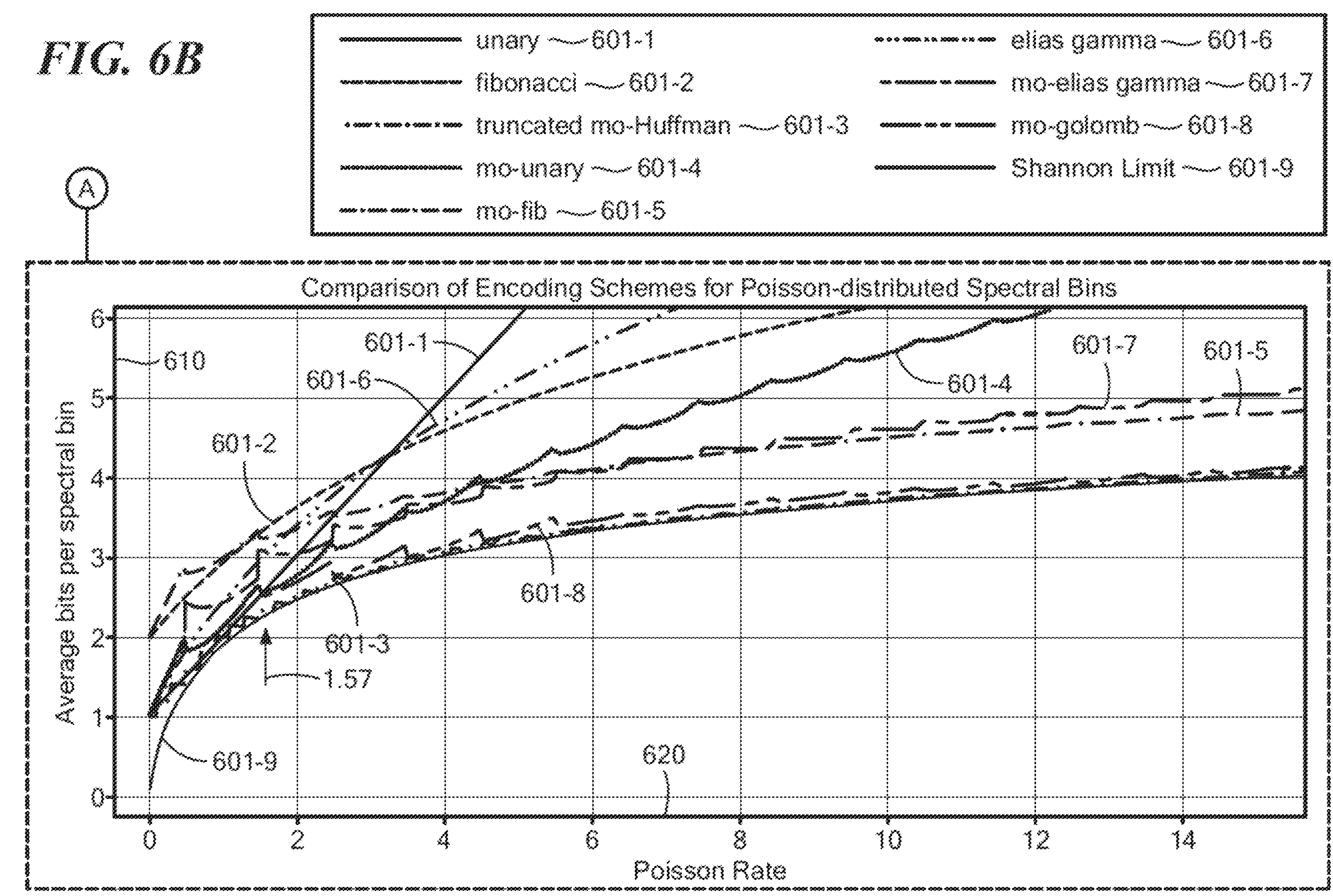

FIGS. 6A and 6B show performance variations of different encoding processors in FIGS. 3-5. Referring to FIGS. 6A and 6B, a comparison of encoding schemes 600 is shown for values based on a Poisson distribution. The average bits per spectral bin is shown on the vertical axis 610, as needed based on a Poisson rate (value) shown on the horizontal axis 620. As can be seen, the unary 601-1 encoding has good performance for small values, but rapidly rises to an uneconomical bit requirement. The parameterized Golomb (Mo Golomb) 601-8, shown in FIG. 5, is generally one of the better performing at high values, surpassing unary encoding at values around 1.57.

Figure 7A:
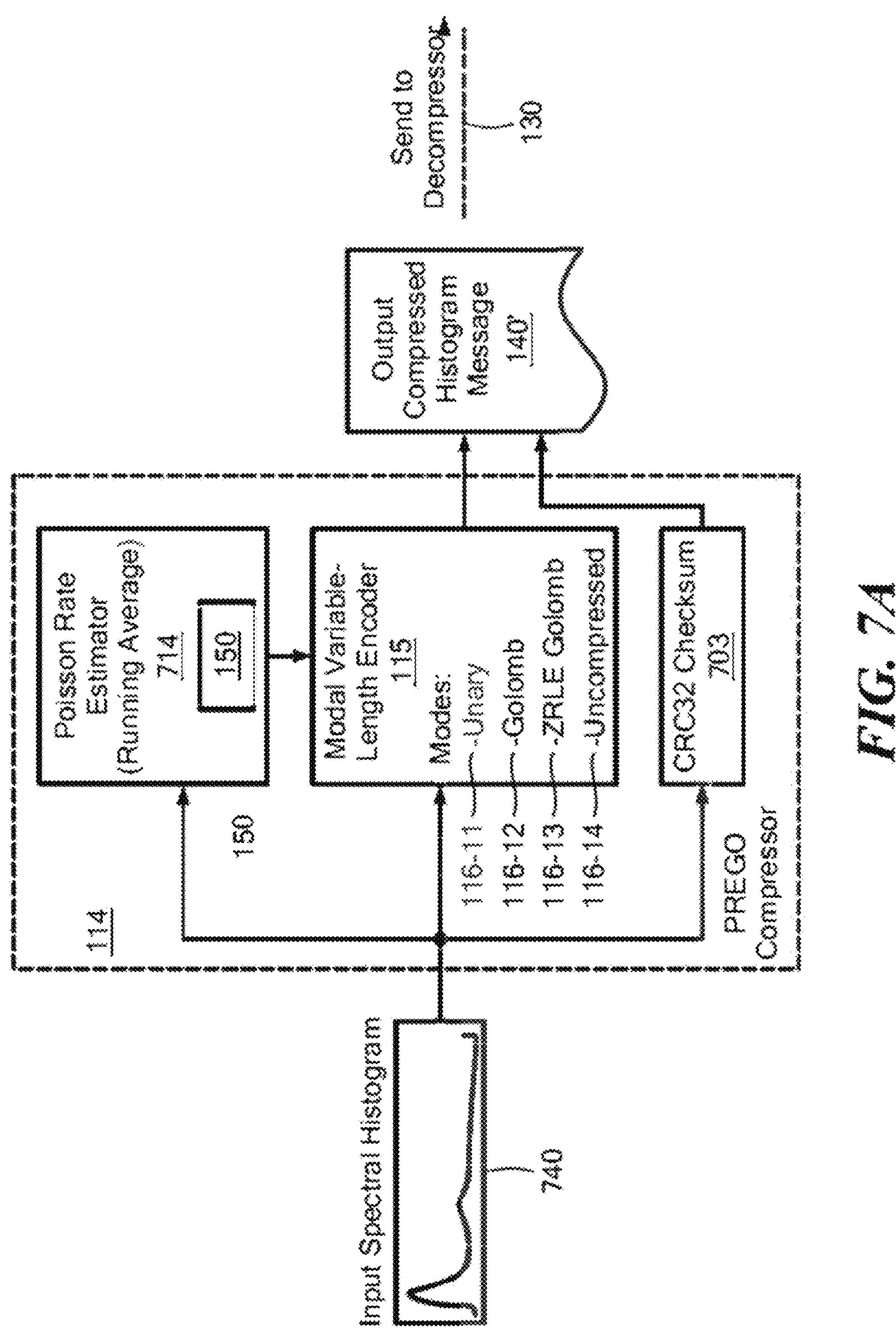
FIGS. 7A and 7B show a block diagram for selection of corresponding encoding and decoding processors as in FIGS. 3-6B.
Figure 7B:
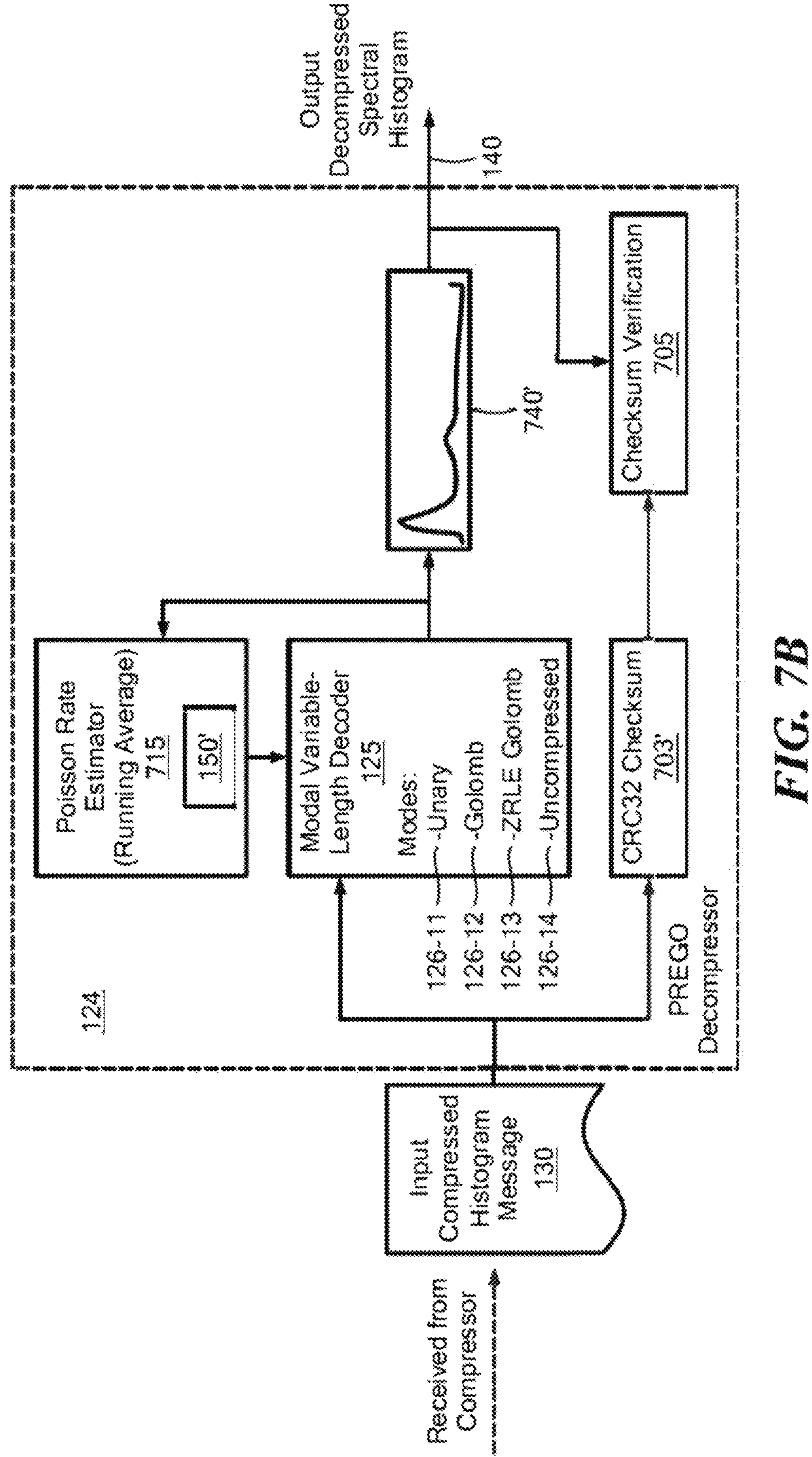

FIGS. 7A and 7B show a block diagram for selection of corresponding encoding and decoding processors as in FIGS. 3-6B. Referring to FIGS. 3-7B, a Poisson Rate Estimation Golomb compression algorithm uses the Poisson distribution of the reference vector 150 to predict successive vectors and select encoding processors 116 accordingly. The corresponding decoding processor 126 is then selected upon receipt at the monitoring facility 120 using the same reference vector 150. In FIG. 7A, for encoding, the encoding application 114 receives an incoming vector 140 defining a spectral histogram 740. A Poisson rate estimator 714 receives the histogram 740 and applies it to the reference vector 150 by summing with the previously received vectors 140-1 . . . 140-(N−1). The encoding logic 115 selects an encoding mode, or algorithm, for use on the histogram 140-N. Note that the current vector 140-N is not applied to the running average in the reference vector until after the current vector 140-N is encoded, otherwise the decoder could not operate on a reference vector 150 based on the same set of vectors 140-1 . . . 140-(N−1). Several encoding modes may be selected, each corresponding to an encoder 116-N. Selectable modes include a unary encoder 116-11, M-Golomb (parameterized) 116-12, Zero Run Golomb 116-13, and uncompressed (unencoded, or clear) 116-14. Other encoders may be provided, but these modes are employed in an example configuration that is particularly beneficial with the radiologic data beacons 110. Selecting the encoder further includes identifying available encoders 116, and determining, from the available encoders 116, an encoder providing maximal compression ratio for the respective value. A checksum 703 may also be provided.

The spectral data 130 is sent as an encoded vector 140', and in FIG. 7B is received by the decoder application 124. The decoder application 125 selects, based on an indication of a resulting encoded size of the value, the encoder processor from a zero packing encoder 126-13, a unary encoder 126-11, a Golomb encoder and a offset encoding parameter 126-12, and an unencoded mode 126-14. A decoder side Poisson Rate Estimator 715 provides the current reference vector 150' based on previous vectors 140-1 . . . 140-(N−1); recall that the encoder 115 and decoder 125 separately compute the reference vector 150, 150' from the same predecessor vectors 140-1 . . . 140-(N−1). Reference vectors are computed based on the previous vector as the decoding side will not have the value of the current vector 140-N until after decoding. The decoded histogram 740' represents the vector 140-N and is passed as output and provided to the Poisson Rate Estimator 715 for use with successive vectors 141.

Figure 8:
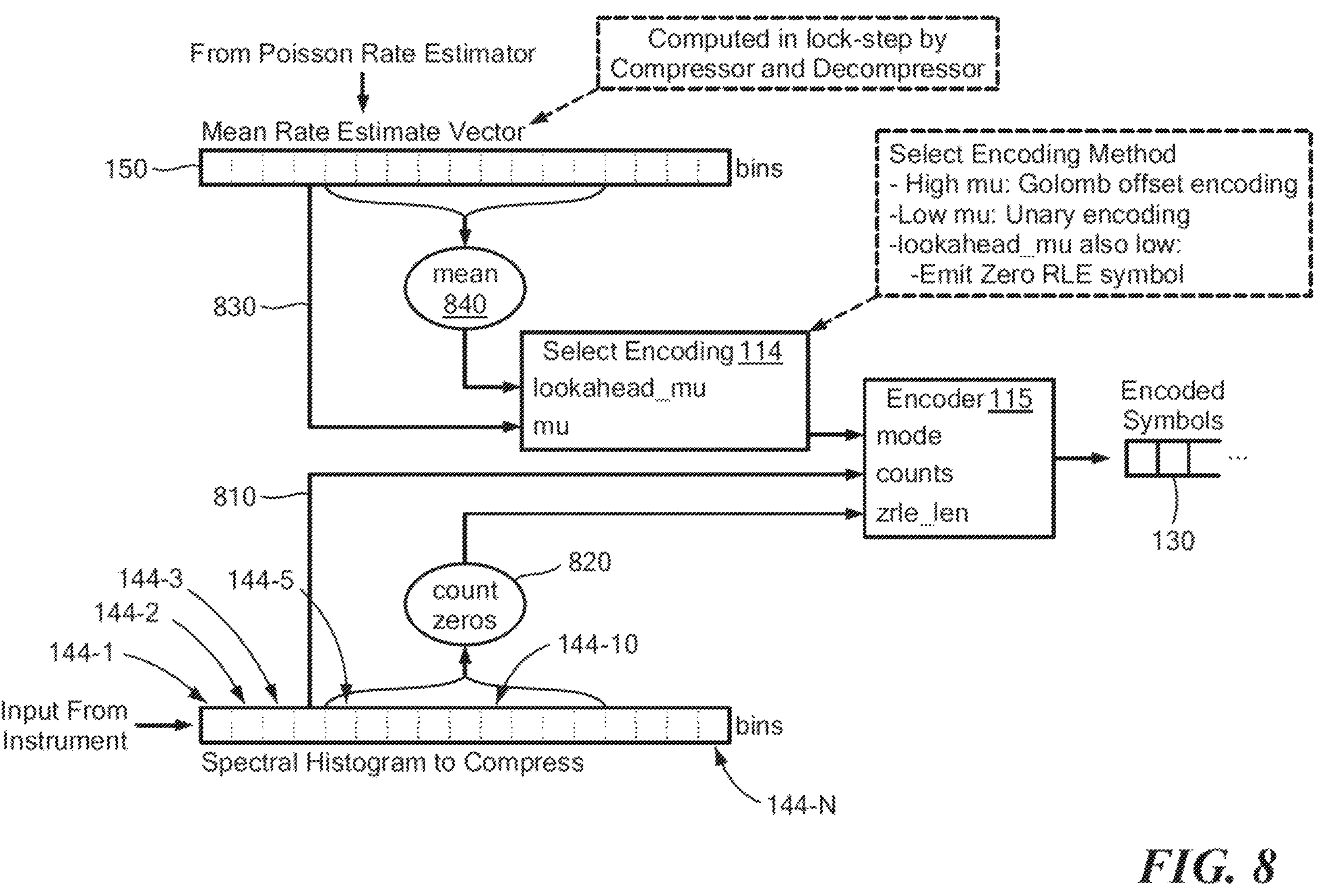
FIG. 8 shows a data flow diagram of encoding processor selection as in FIGS. 6A-7B.

FIG. 8 shows a data flow diagram of encoding processor selection as in FIGS. 6A-7B. Referring to FIGS. 3-8, an input vector 140 sensed by the beacon sensors 112 is received, and encoding proceeds left to right across the positions 144-1 . . . 144-N. At position 144-4, for example, the value 142 is a non-zero value representing the number of counts at the corresponding energy level, received by the encoder 115 as shown at arrow 810. At position 144-5, a zero value is encountered, and an iterative count 820 of zeros is performed to identify a run of zeros, which are efficient to compress.

The encoding application 114 selects the encoding mechanism to be applied to a respective value 142 in a position 144 by determining a position of the respective value in the vector, and indexing a corresponding value in the reference vector based on the determined position. The encoder 115 receives the corresponding positions 144 from the reference vector 150, and Golomb parameter Mu is obtained. In the example shown, position 144-4 of the input vector 140 corresponds to the value 144-4 in the reference vector 150, denoted by arrow 830. The encoding application 114 selects an encoder 116 based on a likelihood that the average value is representative of an efficient encoding mechanism for the respective value 144-4, denoted by the encoding mode which determines the encoding processor 116 invoked.

At position 144-5, a zero value is encountered, and runs to position 144-10. This triggers a zero "run length" encoding mode for the string of zeros, shown by arrow 820. The reference vector 150 also has a mean value 840 for a run of values such as zeros. The encoder application 114 employs the lookahead_mu parameter to select the Golomb M parameter used when encoding a run length of zeros. Recall that the selected encoder 116 affects the efficiency, but not the accuracy, of the resulting encoded data 130. Selection of any of the available encoders will therefore generate encoded symbols that may be losslessly decoded, discussed further below in FIGS. 9A-9B.

Figure 9A:
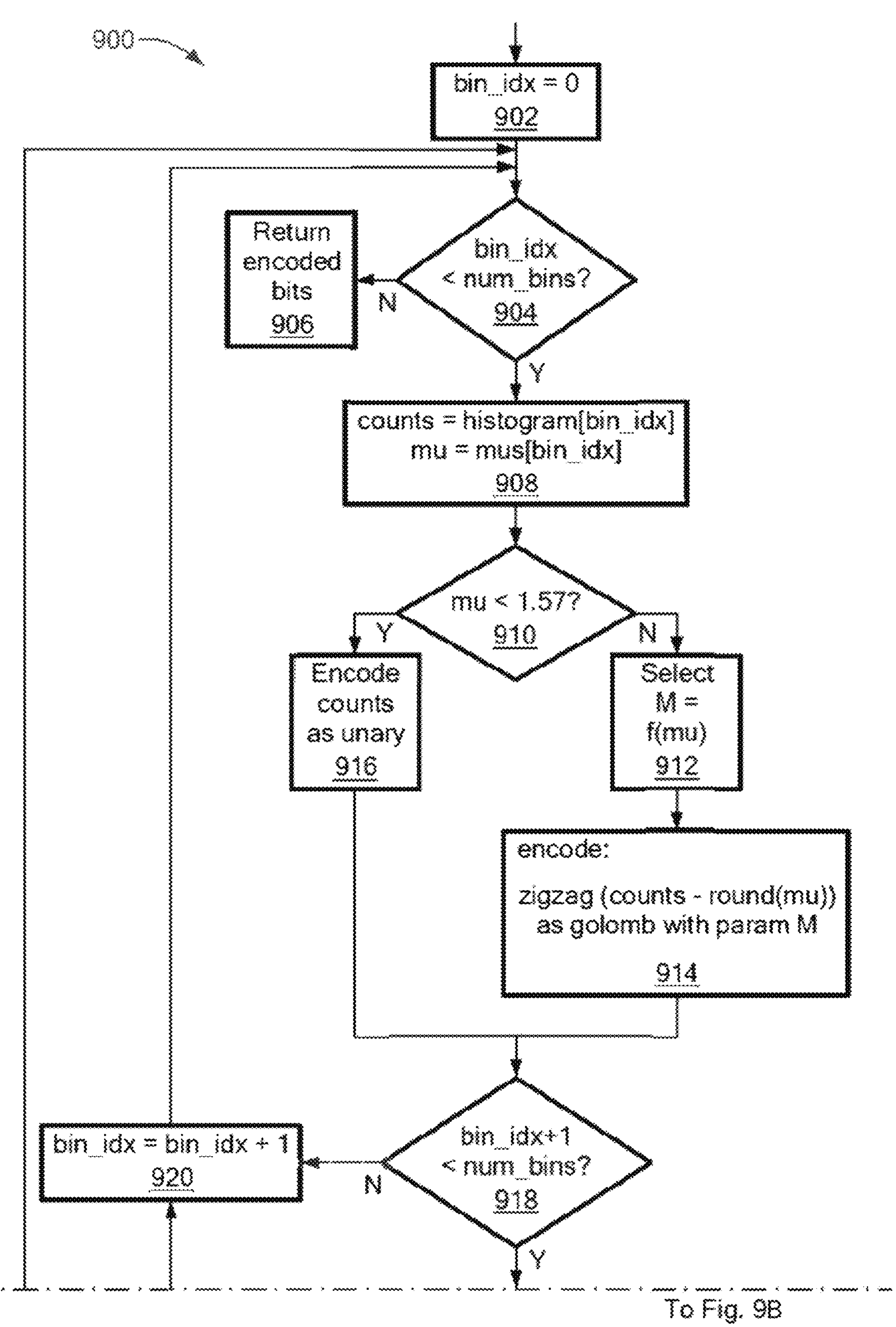
Figure 9B:
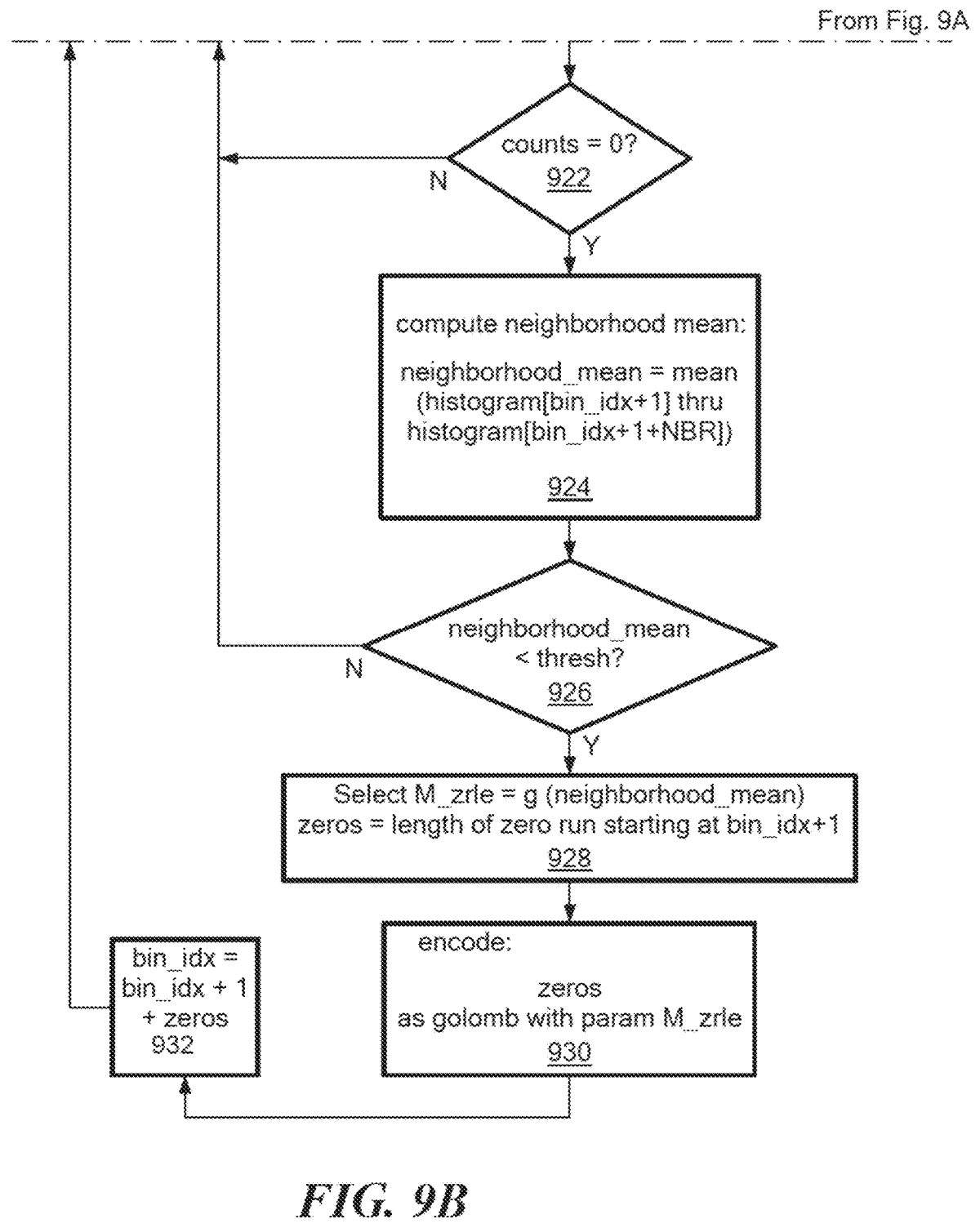

FIGS. 9A-9B are a flowchart for encoding spectral data using encoding processing selection as in FIGS. 3-8. Referring to FIGS. 3-9B, FIGS. 9A-9B depict a flowchart 900 of stepwise progression for encoding the set 141 of vectors 140 as in FIGS. 7A, 7B and 8. In FIGS. 9A-9B, a histogram refers to the current vector 140 being encoded, and mus is an encoding rate as in FIGS. 6A and 6B for the current position 144-N in the vector 140. For encoding a run of zeros or near zero value, thresh is a parameter setting a bound for a run length of zeros, and NBR is a neighborhood mean of a current run of zeros. In FIGS. 9A-9B, encoder modes of FIGS. 7A and 7B define selection of the encoding processors 116 for unary 116-11, Golomb 116-12, Zero run 116-13, and uncompressed (clear) 116-14. At step 902, for each vector 140, a bin index (bin_idx) commences at 0 for the start of the vector 140 (in statistical terms, each bin is the count of the number of sensed radiation readings corresponding to an energy level of the bin). A termination check at step 904 results in returning the encoded result 130, disclosed at step 906. The current value 142 in the vector 140, and an estimate of the encoding rate for that value are identified, as depicted at step 908. Selecting the encoding processor 116 includes parsing the vector 140 representing the histogram, and comparing the ordered value from the vector to a value capable of achieving at least a target encoding rate. At step 910, a check is performed, if the expected encoding rate is below a threshold, 1.57 in the example depicted, the unary encoding processor 116-11 is used, as shown at step 916. This is generally for smaller values, as explained with respect to FIGS. 6A and 6B at the lower end of the curve. If the rate estimate of the current bin mu exceeds the unary encoding rate, a Golomb parameter M is computed at step 912 by function f, which maps the current bin's rate estimate mu to the appropriate Golomb parameter M (perhaps using a precomputed table), and the Golomb encoding processor 116-12 is used at step 914.

In further detail, as described above, the Golomb encoding employs a parameter based on the value to be encoded for incurring a minimal storage burden. At any time-step, given the rate estimate vector based on previously-processed data, the estimated rate mu is employed within each bin to select the optimal encoding mode and parameters. In the case when mean-offset Golomb encoding is used, the optimal Golomb Parameter M is computed using function, E.g.

$$M = f(mu)$$

The function f simply returns the value of M that minimizes the average length (in bits) of a mean-offset Golomb-encoded value with Poisson rate mu. f can be precomputed over the range of interest and suitably approximated at execution time using a straightforward piecewise lookup table with linear interpolation.

A check is performed, at step 918 to determine if all values 142 in the vector have been encoded, and if not, a zero check of the current encoded value is performed at step 922. To more efficiently represent "sparse" spectral data (spectral histograms that contain many zeros), the encoding application 114 may also choose to insert run-length symbols for runs of zeros based on heuristic thresholds computed as a function of the rate estimate. Step 922 checks whether the current ordered value is a zero, which may mark the start of a run of zeros in the ordered values. At step 924, a neighborhood mean is computed across a number of subsequent bins in the rate estimate vector mus. This neighborhood mean is compared at step 926 to a threshold to determine if the subsequent bins are in a "low neighborhood" with mean rate near zero. If the neighborhood mean is less than a threshold, the zero-run-length-encoding mode is invoked at step 928. By modeling the run length as an exponentially-distributed random variable with parameter p equal to the neighborhood mean, the optimal Golomb parameter M is computed by function g( ) as the closest integer to $-1/\log_2(p)$ in step 928. The length of the zero run in the subsequent ordered values is determined at step 928 and encoded at step 930. The index is advanced by one plus the zero run length at step 932, and control reverts to the value (bin) following the zero run. If the neighborhood mean is greater than or equal to the threshold at step 926, no zero-run-length symbol is encoded, the index is advanced by one and control reverts to the next value (bin).

The unencoded (uncompressed) selection for encoding processor 116-14 occurs for the special case of initialization of the reference vector 150 for the first vector processed. When a beacon 110 commences transmission of a sequence of vectors from a beacon by transmitting a first vector in an unencoded, uncompressed manner, this establishes the reference vector 150 based on the first vector for setting the average values represented by the reference vector. The encoding application 114 invokes the reference vector 114 for encoding and decoding of the ordered values in successive vectors 140-N transmitted following the first vector 140-1.

As shown in FIG. 7B, a complementary decoding process occurs upon receipt of the encoded data 130 as a compressed histogram message. Since the selected encoding depends only on the rate estimate computed as a function of previously-observed data, the selected encoding mode can be derived independently by both the encoder and the decoder without being explicitly represented in the compressed data stream. The rate estimator allows the encoding to adapt to changes in the radiological sensor readings due to environmental variation or encounters with large radiological sources, including sudden (in time) variations that cause large "unexpected" distortions in the spectrum.

Those skilled in the art should readily appreciate that the programs and methods defined herein are deliverable to a user processing and rendering device in many forms, including but not limited to a) information permanently stored on non-writeable storage media such as ROM devices, b) information alterably stored on writeable non-transitory storage media such as solid state drives (SSDs) and media, flash drives, floppy disks, magnetic tapes, CDs, RAM devices, and other magnetic and optical media, or c) information conveyed to a computer through communication media, as in an electronic network such as the Internet or telephone modem lines. The operations and methods may be implemented in a software executable object or as a set of encoded instructions for execution by a processor responsive to the instructions, including virtual machines and hypervisor controlled execution environments. Alternatively, the operations and methods disclosed herein may be embodied in whole or in part using hardware components, such as Application Specific Integrated Circuits (ASICs), Field Programmable Gate Arrays (FPGAs), state machines, controllers or other hardware components or devices, or a combination of hardware, software, and firmware components.

While the system and methods defined herein have been particularly shown and described with references to embodiments thereof, it will be understood by those skilled in the art that various changes in form and details may be made therein without departing from the scope of the invention encompassed by the appended claims.

What is claimed is:

1. A method of transmitting a recurring sequence of data, comprising:

generating a sequence of vectors based on readings received by a beacon, each vector in the sequence of vectors defining an array of values in ordered positions;

encoding each vector in the sequence of vectors using an encoding processor selected based on a computed average of the values of each position in the sequence of vectors; and transmitting each encoded vector of the sequence of vectors.

2. The method of claim 1, further comprising:

receiving each encoded vector of the sequence of vectors at a distal network location, the distal network location configured for receiving the encoded vectors from a plurality of beacons.

3. The method of claim 1, further comprising:

receiving each encoded vector of the sequence of vectors; and selecting, for each position in each received vector, a decoding processor corresponding to the encoding processor, the selection based on the same average of values of each position invoked for the encoding.

4. The method of claim 3 further comprising maintaining a reference vector defined by a running average of each respective position, each position in the reference vector computed from the computed average of the values in the corresponding position in the sequence of vectors.

5. The method of claim 4 further comprising computing the reference vector based on an average of the values appearing in each respective position in the sequence of vectors.

6. The method of claim 3 further comprising encoding each value in the vectors in the sequence by selectively applying an encoding mechanism to each value in the vectors, the applied encoding mechanism based on an average of values appearing in the respective position in previous vectors.

7. The method of claim 4 further comprising selecting the encoding processor to be applied to a respective value of each vector of the sequence of vectors by:

determining a position of the respective value in the vector;

indexing a corresponding value in the reference vector based on the determined position; and selecting an encoder based on a likelihood that the average value for determined position is representative of an efficient encoding mechanism for the respective value.

8. The method of claim 7 wherein selecting the encoder further comprises:

identifying available encoders; and determining, from the available encoders, an encoder providing maximal compression ratio for the respective value.

9. The method of claim 3 wherein selecting the encoding processor includes:

comparing an ordered value from a respective ordered position of the vector to a value based on achieving at least a target encoding rate;

invoking, if the ordered value is a zero, a zero run encoding mechanism;

invoking, if the ordered value is within the target encoding rate, a unary encoding; and invoking, if the ordered value is a value for which unary encoding exceeds the target encoding rate, a mean-offset Golomb encoding with a Golomb parameter based on the ordered value.

10. The method of claim 9 further comprising determining the Golomb parameter by performing a lookup of Golomb parameters based on the ordered value.

11. The method of claim 4 further comprising:

commencing transmission of the sequence of vectors from a respective beacon by transmitting a first vector in an unencoded, uncompressed manner;

establishing the reference vector based on the first vector; and invoking the reference vector for encoding and decoding of the ordered values in successive vectors transmitted following the first vector.

12. The method of claim 3 wherein the beacons are radiologic beacons adapted for receiving radiation spectrum data of detected radiation; and each vector of the sequence of vectors defines a set or ordered values indicative of a radiation energy level; and each of the positions in the vector of the sequence of vectors defines increasing energy levels of radiation detected at a geographic position of the respective beacon from which the radiation spectrum data was received.

13. The method of claim 3 further comprising selecting, based on an indication of a resulting encoded size of a respective value of the array of values, the encoding processor from:

a zero packing encoder;

a unary encoder; and a mean-offset Golomb encoder with an encoding parameter optimized for a predetermined probability distribution.

* * * * *